(12) United States Patent
Ohuchi et al.

(10) Patent No.: US 6,246,734 B1
(45) Date of Patent: Jun. 12, 2001

(54) VEHICLE COMMUNICATION SYSTEM

(75) Inventors: Katsuhiro Ohuchi; Morio Sato, both of Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/015,902

(22) Filed: Jan. 30, 1998

(30) Foreign Application Priority Data

Jan. 30, 1997 (JP) .................................................. 9-017162

(51) Int. Cl.[7] .................................. H04L 7/00; B06L 1/00
(52) U.S. Cl. .......................... 375/357; 375/3.54; 307/10.1
(58) Field of Search ..................................... 375/357, 354, 375/355, 356, 368, 219; 701/1, 10; 340/441; 307/10.1

(56) References Cited

U.S. PATENT DOCUMENTS 5,495,469 * 2/1996 Halter et al. ........................ 370/212
6,087,736 * 7/2000 Ohuchi et al. ...................... 307/10.1

FOREIGN PATENT DOCUMENTS 2-7022431    3/1995  (JP) .

* cited by examiner

*Primary Examiner*—Chi Pham
*Assistant Examiner*—Khai Tran
(74) *Attorney, Agent, or Firm*—Birch, Stewart Kolasch & Birch, LLP (57) ABSTRACT

This vehicle communication system is suitable for high speed communication with small signal distortion. The communication system for a vehicle includes, provided with charge and discharge that allow a distributed capacitance of a signal line to be discharged by making a stored charge by-pass a pull-up resistor, or causing the distributed capacitance of the signal line 5 to be charged up by making a charge by-pass a pull-up resistor. The charge and discharge units charge or discharge for only a fixed period of time. This fixed period of time is shorter than 1 bit length of the signal, from when transistors are switched from on to off. For a node connected through the signal line, this fixed period of time is longer than the time taken for a reception circuit that is providing a reception signal from the signal line to switch on or off.

20 Claims, 6 Drawing Sheets

VEHICLE COMMUNICATION SYSTEM

FIELD OF INVENTION

The present invention relates to a vehicle communication system for use in a motorcycle, car, or similar vehicle, and particularly to a vehicle communication system suitable for high speed communication with reduced pulse signal waveform distortion.

BACKGROUND OF THE INVENTION

Japanese Patent publication No. Hei 7-22431, discloses a mobile communication system in which various transceiver unit (node) sets are connected by single signal lines. Reduction in weight and cost, as well as improvement in communication efficiency, is made possible by simplifying the previous communication system construction.

Figure 6:
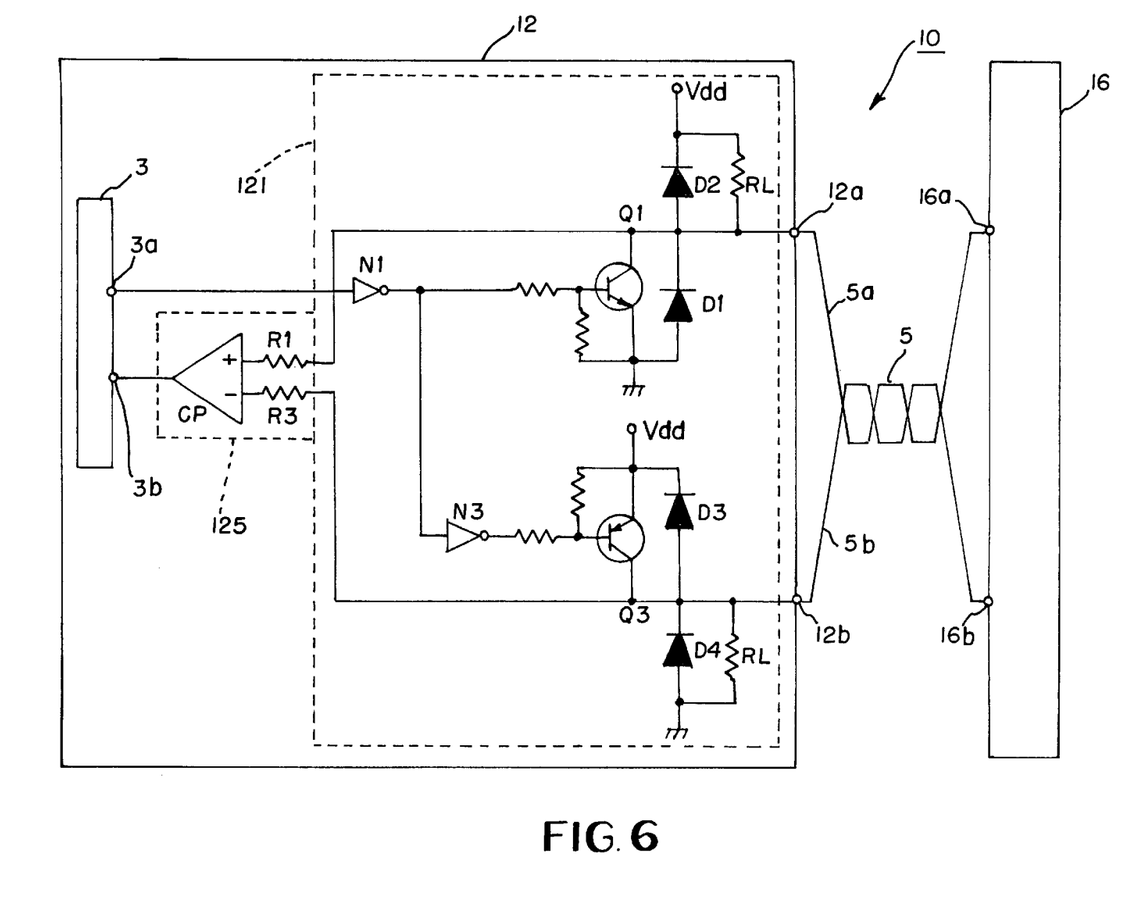
FIG. 6 is a circuit diagram of a vehicle communication system of the related art.

A circuit diagram of a conventional vehicle communication system for carrying out communication between nodes is shown in FIG. 6. A balanced cable 5 is used as the signal line, which is a twisted pair cable. Node 16 has the same configuration as node 12.

Node 12 is equipped with a transmission circuit 121, a reception circuit 125, and a microcomputer 3. The microcomputer 3 outputs a transmission signal through an output terminal 3a, and this transmission signal acts as a control signal for simultaneously controlling both transistors Q1 and Q3. The reception circuit 125 is equipped with a comparator CP for outputting a reception signal to the input terminal 3b of the microcomputer 3, and resistors R1, R3.

The non-inverting input terminal of the comparator CP (+terminal) is connected to terminal 12a through resistor R1, while the inverting input terminal (−terminal) is connected to terminal 12b through resistor R3.

The transmission circuit 121 is equipped with transistors Q1 and Q3, an inverter N1, an inverter N3, diodes D1–D4, and pull-up resistors RL, RL. The inverter N1 generates a control signal for transistor Q1 by inverting the signal transmitted by the microcomputer 3 through the output terminal 3a. The inverter N3 generates a control signal for transistor Q3 by inverting the control signal output from inverter N1.

A power supply voltage Vdd is applied to the collector of transistor Q1 through a pull-up resistor RL, and the collector of transistor Q3 is connected to ground through a pull-up resistor RL. The core of one cable 5a of the balanced cable 5 is connected to the collector of the transistor Q1 through terminal 12a, while the core of the other cable 5b of the balanced cable 5 is connected to the collector of transistor Q3 through terminal 12b.

In node 12, when the microcomputer 3 sets the output terminal 3a to an H (high) level by transmitting an H level signal, the transistors Q1 and Q3 are both turned off. As a result, the potential of terminal 12a of node 12, the cable 5a that is connected to terminal 12a, and terminal 16a of node 16 connected to the cable 5a becomes the power supply voltage Vdd and has an H level signal. Further, the potential of terminal 12b of node 12, the cable 5b that is connected to terminal 12b and terminal 16b of node 16 connected to the cable 5b becomes the ground potential (0 volts) and has an L level signal.

If a signal is transmitted from node 16 via the balanced cable 5, the comparator CP of node 12 obtains a reception signal (H level signal) by differentially amplifying the signal from the balanced cable 5 and outputs an H level signal to the microcomputer 3.

On the other hand, if the output terminal 3a is set to an L (Low) level as a result of the microcomputer 3 transmitting an L level signal, transistors Q1 and Q3 are turned on together. As a result, the potential of terminal 12a of node 12, the cable 5a that is connected to terminal 12a, and terminal 16a of node 16 connected to the cable 5a becomes the ground potential (0 volts) and has an L level signal. Further, the potential of terminal 12b of node 12, the cable 5b connected to terminal 12b and terminal 16b of node 16 connected to the cable 5b becomes the power supply voltage Vdd and has an H level signal.

If a signal is transmitted from node 16 via the balanced cable 5, the comparator CP of node 12 obtains a reception signal (L level signal) by differentially amplifying the signal from the balanced cable 5 and outputs an L level signal to the microcomputer 3.

When the output terminal 3a switches from an L level to an H level, the rise and fall times of a pulse signal are determined by a pull-up resistor RL, and the distributed capacitance of the signal line, etc. Accordingly, when the signal line is long the pulse signal wave shape is distorted.

In order to solve the aforementioned problems, Japanese Patent Laid open Publication No.-Hei 5-292101 discloses a communication system for a vehicle provided with a pull-up resistor and a signal line connected to a transistor, for carrying out communication between respective nodes through the signal line by controlling the transistor. The transistor is also provided with charge and discharge units for causing the distributed capacitance of the signal line to be discharged by making a stored charge by-pass a pull-up resistor, or causing the distributed capacitance of the signal line to be charged by making a charge by-pass a pull-up resistor. The charge and discharge units cause charge or discharge only for a fixed period of time that is less than 1 bit length of a signal from the instant when the transistor is switched from on to off.

The charge and discharge units provide an improved system over the case where the distributed capacitance of the signal line is discharged by passing a stored charge through a pull-up resistor or charged by passing a charge through a pull-up resistor. The rising (and falling) of a signal can be quickened, and pulse signal waveform distortion can be decreased by use of the charge and discharge units.

Further, since the transistor is in an off state for a time of at least 1 bit length after the transistor switches from on to off, charging or discharging can be carried out by by-passing the pull-up resistor during the transistor off state period. Since the transistor is in the off state, large current does not flow across the transistor collector and emitter, thereby preventing damage to the transistor. This benefit is sustained even when resistance of the charge and discharge unit is low at the time of charge and discharge.

However, if charging or discharging by the charge and discharge units is completed during switching of the reception circuit, noise enters the signal line. Accordingly, there is a danger of the on/off switching of the reception circuit becoming slow due to the effect of a level value of a signal on the signal line momentarily becoming reversed (inverted) and then returning to its original level value.

SUMMARY OF THE INVENTION

The present invention is intended to solve the above described problems, and provides as its object a vehicle communication system having a pull-up resistor and a signal line connected to a transistor, for carrying out communication between respective nodes by controlling the transistor, in which pulse signal waveform distortion is small and suitable for high speed communication.

The vehicle communication system of the present invention is provided with charge and discharge units for causing the distributed capacitance of the signal line to be discharged by making a stored charge by-pass a pull-up resistor or causing the distributed capacitance of the signal line to be charged up by making a charge by-pass a pull-up resistor. The charge/discharge units enable charging or discharging for only a fixed period of time shorter than 1 bit length of the signal from when the transistor is switched from on to off. For a node connected through the signal line, this fixed period of time is also longer than the time required for the reception circuit that obtains a reception signal from the signal line to switch on or off.

Charging or discharging by the charge discharge unit for longer than the switching time allows the system to forcibly switch the reception circuit on or off at high speed in response to a receive signal. It is also possible to prevent slow switching of the reception circuit, thereby preventing erroneous reception.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2[A] is a diagram illustrating fluctuations in input terminal voltage of a comparator caused by noise when the comparator is receiving an H level signal;

FIG. 2[B] is a diagram illustrating fluctuations in input terminal voltage of the comparator caused by noise when the comparator is receiving an L level signal;

FIG. 4[A] is a drawing showing comparator input terminal voltage fluctuations at the time of switching a signal;

FIG. 4[B] is a diagram illustrating comparator input terminal voltage fluctuations caused by noise during switching;

DETAILED DESCRIPTION OF THE INVENTION

The exemplary embodiments of the invention claimed in the appended claims may be more fully appreciated by reference to the following description of preferred embodiments. Within the drawing figures, it should be understood that like elements are identified by like reference numbers.

Figure 1:
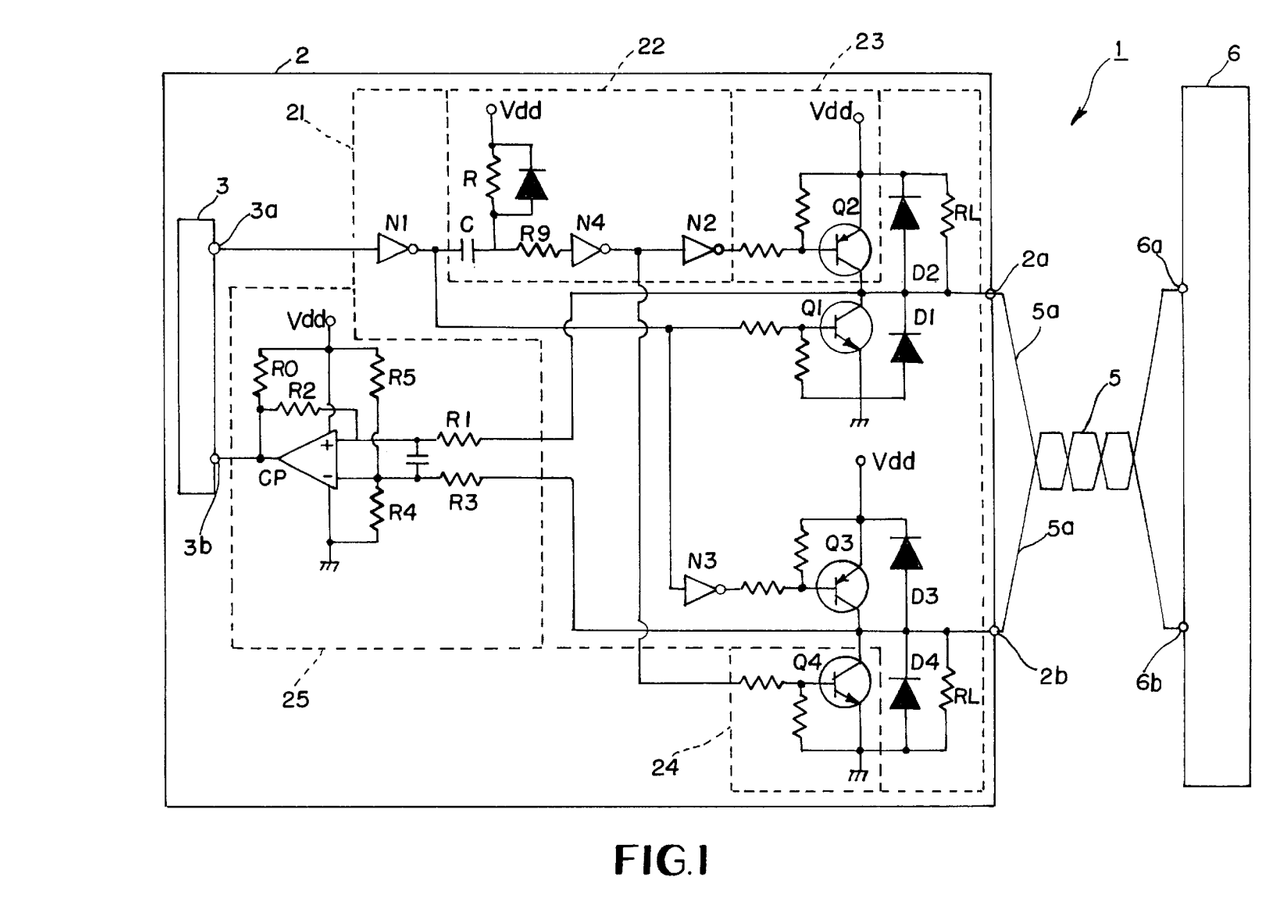
FIG. 1 is a circuit diagram of a vehicle communication system of the present invention.

FIG. 1 is a circuit diagram of a vehicle communication system of the present invention.

A balanced cable 5 is used as a signal line, namely a twisted pair cable. Node 6 has the same configuration as node 2, and terminals 6a and 6b correspond to terminals 2a and 2b, and are connected through the balanced cable 5. The vehicle communication system 1 carries out communication between nodes via the balanced cable 5.

Node 2 is provided with a transmission circuit 21, a trigger pulse generating circuit 22, charge and discharge units 23, 24, a reception circuit 25 and a microcomputer 3. A controller, such as the microcomputer 3 outputs a transmission signal through the output terminal 3a, and this transmission signal is used simultaneously as a control signal for controlling both transistors Q1 and Q3. The transmission circuit 21 is provided with transistors Q1 and Q3, an inverter N1, an inverter N3, diodes D1–D4, and pull-up resistors RL, RL. The inverter N1 generates a control signal for transistor Q1 by inverting a signal that the microcomputer 3 has transmitted through output terminal 3a. The inverter N3 generates a control signal for transistor Q3 by inverting the first control signal.

The power supply voltage Vdd is applied to the collector of transistor Q1 through a pull-up resistor RL, and the collector of transistor Q3 is connected to earth through a pull-up resistor RL. The collector of transistor Q1 is connected to one wire 5a of the balanced cable 5 via terminal 2a, and the collector of transistor Q3 is connected to the other wire 5b of the balanced cable 5 via terminal 2b.

With respect to node 2, if output terminal 3a is set to an H (high) level by the microcomputer 3 transmitting an H level signal, transistor Q1 and transistor Q3 are both turned off. As a result, the potential of terminal 2a of node 2, the wire 5a that is connected to terminal 2a, and the terminal 6a of node 6 connected to the wire 5a becomes high, namely the power supply potential Vdd. In addition, the potential of terminal 2b of node 2, the wire 5b that is connected to terminal 2b, and the terminal 6b of node 6 connected to the wire 5b becomes low, namely the earth potential (volts).

If a signal is transmitted from node 6 via the balanced cable 5, the comparator CP inside the reception circuit 25 of node 2 obtains a reception signal (H level signal) by differentially amplifying the signal from the balanced cable 5 and outputs an H level to the microcomputer 3. On the other hand, if the output terminal 3a is set to an L (Low) level as a result of the microcomputer 3 transmitting an L level signal, transistors Q1 and Q3 are turned on together. As a result, the potential of terminal 2a of node 2, the cable 5a connected to terminal 2a and terminal 6a of node 6 connected to the cable 5a becomes low, the ground potential (0 volts). The potential of terminal 2b of node 2, the cable 5b connected to terminal 2b and terminal 6b of node 6 connected to the cable 5b becomes the power supply voltage Vdd and are at an H level.

If a signal is transmitted from node 6 via the balanced cable 5 a comparator CP of node 2 obtains a reception signal (L level signal) by differentially amplifying the signal from the balanced cable 5. The comparator CP then outputs an L level to the microcomputer 3.

The reception circuit 25 is provided with resistors R0–R5, a capacitor, and the comparator CP for outputting the reception signal to the input terminal 3b of the microcomputer 3. The inverting input terminal (−terminal) and non-inverting input terminal (+terminal) of the comparator CP are connected through a capacitor to eliminate noise.

The non-inverting input terminal (+terminal) of the comparator CP and the wire 5a are connected through terminal 2a and resistor R1. The inverting input terminal (−terminal) and the wire 5b are connected through the terminal 2b and the resistor R3. The resistance values of resistor R1 and resistor R3 are the same.

The inverting input terminal (−terminal) of the comparator CP is connected to the supply terminal for the power supply voltage Vdd through a resistor R5 having a resistance value twice that of resistor R1. The inverting input terminal is also connected to earth through a resistor R4 also having a resistance value twice that of resistor R1. Here, the expression "twice" includes the general meaning of approximately twice.

The non-inverting input terminal (+terminal) and the output terminal of the comparator CP are connected through a resistor R2 having the same (which includes approximately the same) resistance value as resistor R1. The output terminal of the comparator CP and the supply terminal of the power supply voltage Vdd are connected.

The output terminal of the comparator CP and the supply terminal of the power supply voltage Vdd are connected through a resistor R0 acting as an open collector. Resistor R0 has a resistance value much smaller than that of resistor R1.

Equations representing the relationship between the resistance values can be expressed, for example, as follows:

$$R0 \ll R1, R3=R1, R2=R1, R4=2 \times R1, R5=2 \times R1.$$

For example, R0=1kO, R1=R2=R3=24kO, R4=R5=47kO.

Even if noise exceeding Vdd enters the balanced cable 5, the noise can be clipped to Vdd by diodes D2 and D3. If the potential of terminals 2a and 2b fluctuates, the noise can be limited to a maximum of Vdd.

If noise below the earth potential of 0 (volts) enters the balanced cable 5, the noise can be clipped to 0 (volts) by diodes D1 and D4. If the potential of terminals 2a and 2b fluctuates, it can be limited to a minimum of 0 (volts).

Figure 2A:
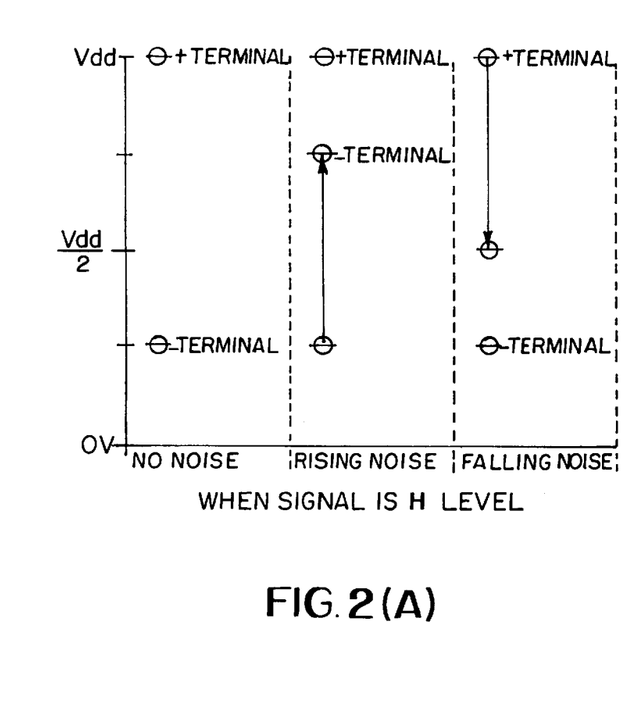
Figure 2B:
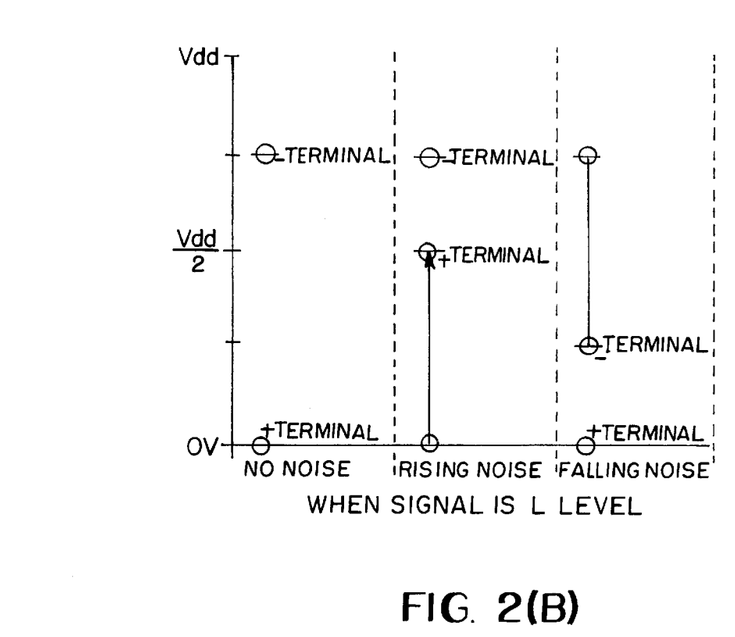

FIG. 2 is a drawing illustrating fluctuations in the input terminal potential of the comparator CP caused by noise. FIG. 2[A] shows a case when the comparator CP is receiving an H level signal, and FIG. 2[B] shows a case when the comparator CP is receiving (output) an L level signal.

The comparator CP receives an H level signal. If the non-inverting input terminal (+terminal) is at Vdd and the inverting input terminal (−terminal) is about (¼) Vdd, then when noise enters the balanced cable 5, the terminals 2a and 2b momentarily become Vdd. It is possible to divide this Vdd by ½ using resistor R3 and resistors R4, R5 (R4//R5). It is also possible to limit the rising of the input voltage of the inverting input terminal (−terminal) to about (¾) Vdd. The input voltage of the non-inverting input terminal (+terminal) can be kept at Vdd.

When noise enters the balanced cable 5 and the terminals 2a and 2b momentarily become 0 (volts), the lowering of the input voltage of the non-inverting input terminal (+terminal) can be limited to about (½) Vdd by dividing using resistors R1 and R2. Similarly, the input voltage of the inverting input terminal (−terminal) can be kept at about (¼) Vdd by dividing Vdd using resistor R4 and resistors R4, R3 (R4//R3).

The comparator CP receives an L level signal. If the non-inverting input terminal (+terminal) is at 0 (volts) and the inverting input terminal (terminal) is about (¾) Vdd, then when noise enters the balanced cable 5, the terminals 2a and 2b momentarily become Vdd. It is possible to divide this Vdd by ½ using resistor R1 and resistors R2, and it is possible to limit the rising of the input voltage of the non-inverting input terminal (+terminal) to about (½) Vdd. The input voltage of the inverting input terminal (−terminal) can also be kept at about (¾) Vdd.

When noise enters the balanced cable 5 and the terminals 2a and 2b momentarily become 0 (volts), the lowering of the input voltage of the inverting input terminal (−terminal) can be limited to about (¼) Vdd by dividing using resistor R5 and resistors R4 and R3 (R4//R3). Further, the input voltage of the non-inverting input terminal (+terminal) can be kept at about 0 (volts).

The charge and discharge units 23 and 24 are respectively provided with transistors Q2 and Q4, bias resistors connected across the base and emitter of these transistors Q2 and Q4, and base resistors connected to the bases.

Terminal 2a is connected to the collector of transistor Q2 constituting a switching element, and the power supply voltage Vdd is applied to the emitter. This switching element is connected in parallel with a pull-up resistor RL.

Terminal 2b is connected to the collector of transistor Q4 constituting a switching element. The emitter is connected to earth, and this switching element is connected in parallel with a pull-up resistor RL.

The charge unit 23 allows for charging the distributed capacitance of the wire 5a of the balanced cable 5 by making a charge by-pass pull-up resistor RL such that the signal wave shape distortion is small. It is also possible to speed up the rise time of a signal compared to the previously discussed case where the distributed capacitance of the balanced cable 5 is charged up by by-passing a pull-up resistor RL.

The discharge unit 24 allows for discharging the distributed capacitance of the wire 5b of the balanced cable 5 by making a stored charge by-pass pull-up resistor RL and the signal wave shape can be made small. It is also possible to speed up the fall time of a signal compared to the previously discussed case where the distributed capacitance of the balanced cable 5 is charged up by making a charge by-pass a pull-up resistor RL.

Figure 3:
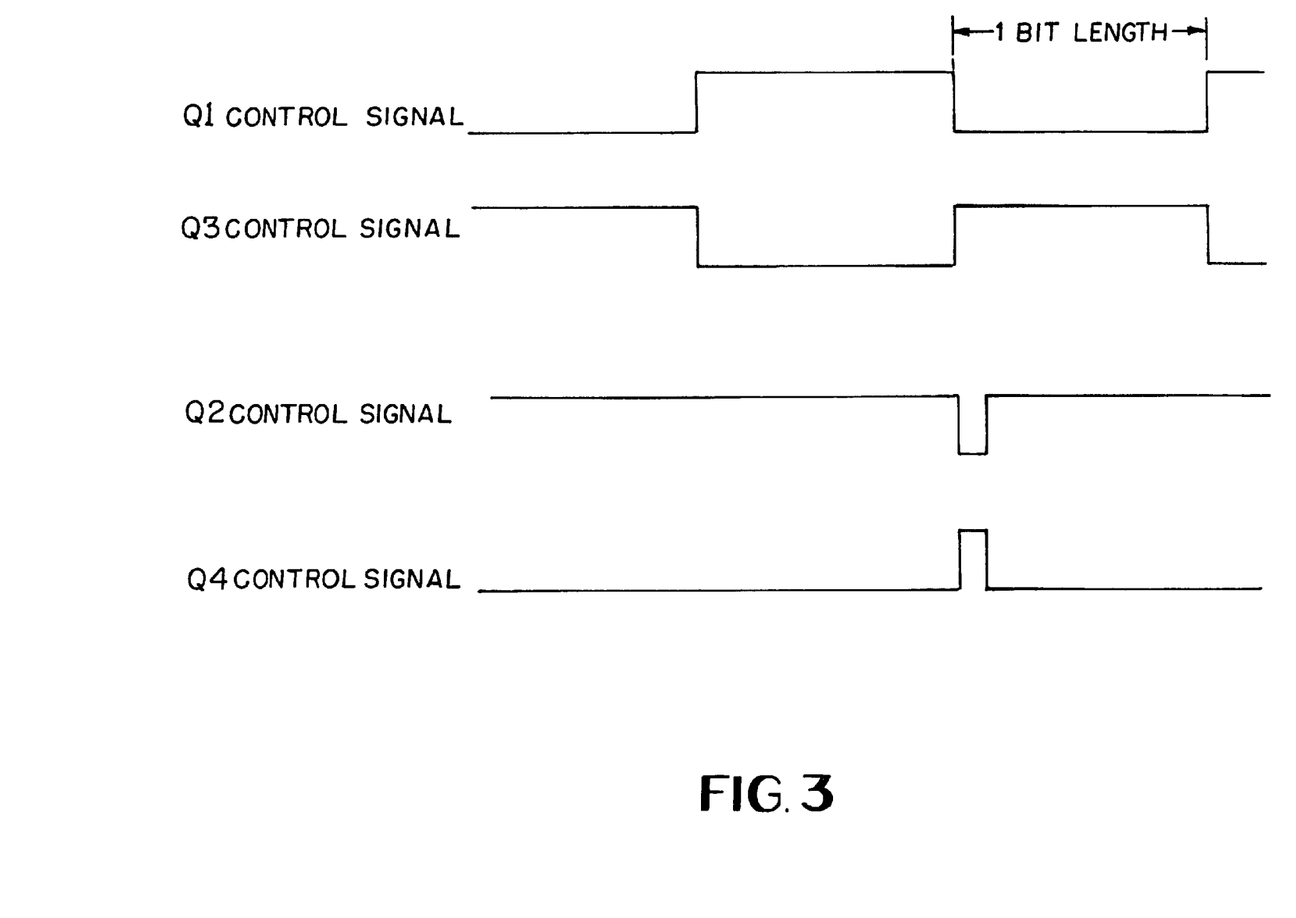
FIG. 3 is a timing chart of each of the control signals for transistors Q1–Q4.

The control signal for transistors Q2 and Q4 is provided by a trigger pulse generated from the control signal of transistor Q1. FIG. 3, shows a timing chart of each of the control signals for transistors Q1–Q4.

As shown in FIG. 1, by transmitting an H/L level signal from the output terminal 3a of the microcomputer 3 the control signal for transistor Q1 is generated through inverter N1, and the control signal for transistor Q3 is produced by inverting this control signal using inverter N3.

The control signal for transistor Q4 is generated from the control signal for transistor Q1 after it has passed through a differentiating circuit comprised of capacitor C and resistor R9, and a wave shaping circuit comprised of the inverter N4. The control signal for transistor Q2 is generated by inverting this control signal using inverter N2.

When the control signal of transistor Q1 stays at an L level, the control signal of transistor Q3 stays at an H level, and transistors Q1–Q4 are all off. The wire 5a connected to terminal 2a is at an H level, and the wire 5b connected to terminal 2b is at an L level.

The signal transmitted by the microcomputer 3 via the output terminal 3a is switched at a length that is an integer number of times a single bit length.

If the control signal of transistor Q1 is switched to an H level, transistors Q1 and Q3 are turned on, while transistors Q2 and Q4 remain off. The wire 5a connected to terminal 2a becomes an L level, and the wire 5b connected to terminal 2b becomes an H level.

If the control signal of transistor Q1 is switched to an L level, transistors Q1 and Q3 are turned off. Transistors Q2 and Q4 are turned on simultaneously, but are turned off quickly within the time of 1 bit length.

Namely, the circuit structure is such that the control signal for transistors Q1 and Q2 are switched from an H level to an L level. Since the power supply voltage Vdd is applied to one end of the capacitor C through resistor R and the capacitor is charged according to the time constant determined by this C and R, the control signal of transistor Q2 is switched from an L level to an H level in a short time, and a trigger pulse is generated.

The trigger pulse generating circuit 22 is provided with resistors R and R9, a diode having the power supply voltage Vdd on the cathode and being connected in parallel with the resistor R, a capacitor C having one end connected to an output terminal of inverter N1 and another end supplied with the power supply voltage Vdd through resistor R, an inverter N4 connected to the other end of the capacitor through resistor R9, and an inverter N2. The pulse width of the trigger pulse is made shorter to less than 1 bit length by adjusting the time constant determined by C and R.

As a result, transistor Q2 is on for only a fixed period of time (the time of the pulse width of the trigger pulse) which is shorter than a 1 bit length of a signal from the time when transistor Q1 is switched from on to off. Further, the distributed capacitance of the wire 5a is charged up by making a charge by-pass pull-up resistor RL.

The operation of transistors Q3 and Q4, is the same as the operation of transistors Q1 and Q2 described above. However, transistor Q2 charges up the distributed capacitance of the wire 5a by making a charge by-pass the pull-up resistor RL, but transistor Q4 charges up the distributed capacitance of wire 5b by making a charge by-pass pull-up resistor RL.

Figure 4A:
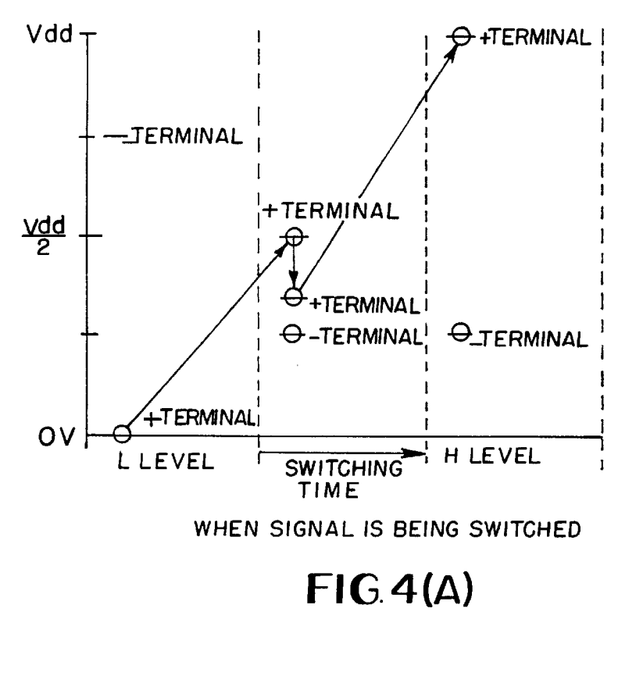
Figure 4B:
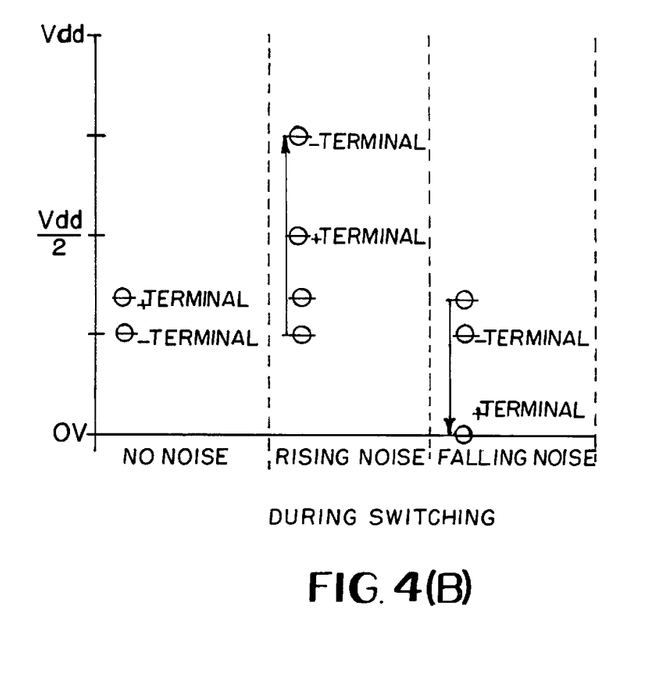

FIG. 4 is a drawing for illustrating fluctuations in input terminal voltage of the comparator CP at the time of switching the signal.

As shown in FIG. 4[A], when the output of the comparator CP is an L level, the inverting input terminal (−terminal) is at about (¾) Vdd and the non-inverting input terminal (+terminal) is at the earth potential 0 (volts). If transistors Q1 and Q3 are turned off and transistors Q2 and Q4 are turned on, the non-inverting input terminal (+terminal) becomes about (½) Vdd and the inverting input terminal (−terminal) becomes about (¼) Vdd.

Then, within the switching time period when the comparator CP is switched from off to on (when the output of the comparator switches from an L level to an H level), if the transistors Q2 and Q4 are turned off, the inverting input terminal (−terminal) stays at about (¼) Vdd but the non-inverting input terminal (+terminal) becomes {R2/(R1+R2+RL)}. Therefore, when the output of the comparator is switched from an L level to an H level, the inverting input terminal (−terminal) stays at about (¼) Vdd and the non-inverting input terminal (+terminal) becomes Vdd.

Within this switching time, noise enters the balanced cable 5 because transistors Q2 and Q4 are turned off and charging and discharging by transistors Q2 and Q4 is completed. The circuit becomes sensitive to noise because of a reduction in differential input voltage. Thus, the level value of signals on respective wires 5a, 5b is sometimes momentarily reversed (inverted) because of the noise, and the on/off switching of the comparator CP is slowed down.

Fluctuations in input terminal voltage caused by noise at the time of switching, and momentary reversal (inversion) of signal level value are shown in FIG. 4[B]. When there is no noise, the inverting input terminal (−terminal) remains at about (¼) Vdd, and the non-inverting input terminal (+terminal) remains at {R2/(R1+R2+RL)}. However, RL<2×R1.

When noise enters the balanced cable 5 and the balanced cable 5 momentarily becomes Vdd, the inverting input terminal (−terminal) rises to about (¾) Vdd, the non-inverting input terminal (+terminal) rises to about (½) Vdd, and the signal level value is reversed. When noise enters the balanced cable 5 and the balanced cable 5 momentarily becomes 0 (volts), the inverting input terminal (−terminal) remains at about (¼) Vdd and the non-inverting input terminal (+terminal) falls to 0 (volts), and the signal level value is reversed.

Figure 5:
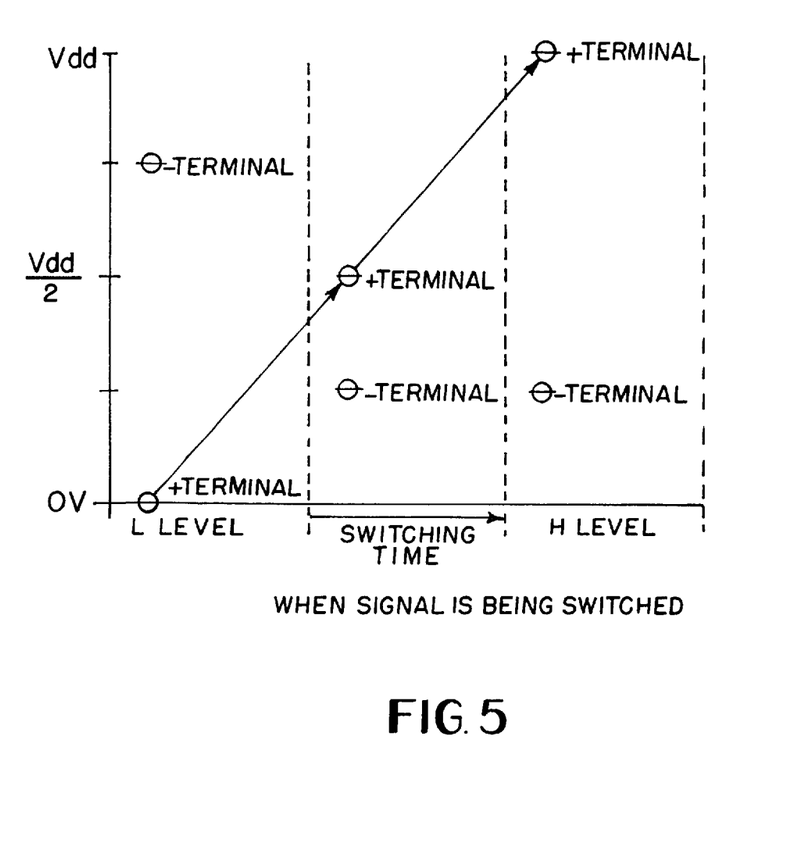
FIG. 5 is a drawing showing comparator input terminal voltage fluctuations at the time of switching a signal.

Input terminal voltage fluctuations for the case where the pulse width time is longer than the switching time and charging or discharging is carried out by the charge and discharge units for longer than the switching time are shown in FIG. 5. By charging and discharging in this way, it is possible to forcibly switch the reception circuit 25 on or off at high speed in response to a receive signal. Regarding the comparator CP, it is possible to prevent switching of the receive unit from becoming slow. Accordingly, erroneous reception can be prevented.

It is possible to have a configuration where node 2 only carries out reception and node 6 only carries out transmission. The balanced cable 5 is preferably a twisted pair cable (balanced line) but may also be a single pair wire (balanced line). Vdd is preferably applied to the emitter of transistor Q2 through a resistor having a resistance value much smaller than that of the pull-up resistor RL. The power supply voltage Vdd is preferably, for example, 5V. The control signals of transistor Q2 and transistor Q4 can be generated by unit of another converter provided connected to the output terminal 3a, instead of inverter N1.

According to the vehicle communication device of the present invention, by charging or discharging by the charge and discharge units for longer than the switching time, it is possible to forcibly switch the reception circuit on or off at high speed in response to a receive signal. It is also possible to prevent switching of the reception circuit unit from becoming slow, and as a result erroneous reception can be prevented.

According to the present invention as has been described above, it is possible to produce a pulse signal waveform having small distortion by limiting electrical power consumption while employing a communication method signal which assumes (data) conflict, and it is possible to provide a highly reliable vehicle communication system suitable for high speed communications.

It should be apparent from the aforementioned description and attached drawings that the concept of the present application may be readily applied to a variety of preferred embodiments including those disclosed herein. Accordingly, the scope of the invention described in the instant application should be limited solely by the appended claims.

What is claimed:

1. A vehicle communication system for preventing erroneous reception during high speed communication between a plurality of transceivers connected by a signal line, one of the transceivers comprising:

a control signal for controlling switching of a transistor from on to off;

charge means for charging a distributed capacitance of the signal line for a fixed period of time by making an electric charge by-pass a first pull-up resistor;

discharge means for discharging the distributed capacitance of the signal line for the fixed period of time by making a stored electric charge by-pass a second pull-up resistor; and reception means for obtaining a reception signal from the signal line to switch one of on or off, wherein the fixed period of time is shorter than one bit length of the control signal from when the transistor is switched and longer than a switching time period of the reception means.

2. The vehicle communication system of claim 1, further comprising transmission means for generating the control signal by inverting a transmission signal and transmitting the control signal to the transistor.

3. The vehicle communication system of claim 2, wherein the transmission means is also for generating another control signal by inverting the control signal and transmitting the control signal to another transistor.

4. The vehicle communication system of claim 2, further comprising:
   means for outputting the transmission signal to the transmission means; and
   means for receiving the reception signal from the reception means.

5. The vehicle communication system of claim 1, further comprising trigger pulse generating means for generating trigger pulses having a width less than one bit length of the control signal.

6. The vehicle communication system of claim 1, wherein the signal line is a twisted pair cable.

7. The vehicle communication system of claim 1, wherein another of the transceiver has identical structure as the one of the transceivers.

8. A vehicle communication system for preventing erroneous reception during high speed communication between a plurality of transceivers connected by a signal line, one of the transceivers comprising:
   a control signal for controlling the switching of a transistor from on to off;
   a charging circuit that charges a distributed capacitance of the signal line for a fixed period of time by making an electric charge by-pass a first pull-up resistor;
   a discharging circuit that discharges the distributed capacitance of the signal line for the fixed period of time by making a stored electric charge by-pass a second pull-up resistor; and
   a reception circuit that obtains a reception signal from the signal line to switch one of on or off, wherein the fixed period of time is shorter than one bit length of the control signal from when the transistor is switched and longer than a switching time period of the reception circuit.

9. The vehicle communication system of claim 8, wherein the signal line is a twisted pair cable.

10. The vehicle communication system of claim 8, wherein the charging circuit includes a second transistor connected to a power supply voltage.

11. The vehicle communication system of claim 10, wherein the discharging circuit includes a third transistor connected to a ground voltage.

12. The vehicle communication system of claim 8, further comprising a transmission circuit that generates the control signal by inverting a transmission signal and transmits the control signal to the transistor.

13. The vehicle communication system of claim 12, wherein the transmission circuit generates another control signal by inverting the control signal and transmits the control signal to another transistor.

14. The vehicle communication system of claim 12, wherein the transmission circuit includes a transmission inverter, the transistor, diodes for clipping undesirable noise and the first and second pull-up resistors, one of the power supply voltage and the ground voltage being connected to a collector of the transistor through one of the first and second pull-up resistors.

15. The vehicle communication system of claim 12, further comprising a controller that outputs the transmission signal to the transmission circuit and receives the reception signal from the reception circuit.

16. The vehicle communication system of claim 15, wherein the reception circuit has an inverting input terminal and a non-inverting input terminal and includes a comparator for outputting the reception signal to the controller, the inverting input terminal is connected to the power supply voltage, and the inverting input terminal and the non-inverting input terminal are connected through a reception circuit capacitor for eliminating noise.

17. The vehicle communication system of claim 15, wherein the controller is a microcomputer.

18. The vehicle communication system of claim 8, further comprising a trigger pulse generating circuit that generates trigger pulses having a width less than one bit length of the control signal.

19. The vehicle communication system of claim 18, wherein the trigger pulse generating circuit includes:
   a pulse generating circuit resistor,
   a pulse generating circuit diode having a cathode connected to a power supply voltage, the diode being connect in parallel to the pulse generating circuit resistor, and
   a pulse generating circuit capacitor having a first end connected to an output terminal of a first inverter and a second end connected to a second inverter and to the power supply through the first pulse generating circuit resistor.

20. A method for preventing erroneous reception during high speed communication between a plurality of transceivers connected by a signal line, comprising the steps of:
   controlling switching of a transistor from on to off;
   charging a distributed capacitance of the signal line for a fixed period of time by making an electric charge by-pass a first pull-up resistor;
   discharging the distributed capacitance of the signal line for the fixed period of time by making a stored electric charge by-pass a second pull-up resistor; and
   obtaining a reception signal from the signal line to switch a unit one of on or off, wherein the fixed period of time is shorter than one bit length of the control signal from when the transistor is switched and longer than a time period required for switching the unit.

* * * * *